United States Patent [19]

Madsen et al.

[11] Patent Number: 4,479,111

[45] Date of Patent: Oct. 23, 1984

[54] PHOTO-OPTICAL SWITCH APPARATUS

[75] Inventors: Craig C. Madsen, Indian Harbour Beach; Daniel B. Stewart, Middleburg; James Andree, Orange Park, all of Fla.

[73] Assignee: Burroughs Corporation, Detroit, Mich.

[21] Appl. No.: 347,244

[22] Filed: Feb. 9, 1982

[51] Int. Cl.³ .................. G06F 3/02; H01H 3/12; H01H 13/00; H01H 13/14
[52] U.S. Cl. .................. 340/365 P; 200/340; 250/229; 340/407
[58] Field of Search ............ 340/365 R, 365 P, 407; 200/276, 340, 159 R; 400/276, 477; 250/229

[56] References Cited

U.S. PATENT DOCUMENTS

| | | | |
|---|---|---|---|
| 3,773,997 | 11/1973 | Evans | 200/153 V |
| 4,034,177 | 7/1977 | Sims | 200/159 R |
| 4,088,855 | 5/1979 | Emery | 200/276 |
| 4,301,345 | 11/1981 | Balta | 250/229 |
| 4,348,122 | 9/1982 | Balta | 340/365 P |
| 4,418,252 | 11/1983 | Daigle | 200/276 |

Primary Examiner—James J. Groody
Attorney, Agent, or Firm—Carl Fissell, Jr.; Edmund M. Chung; Kevin R. Peterson

[57] ABSTRACT

Photo-optical switch apparatus provided with integral, positive, mechanical, tacticle feedback mechanism wherein a horizontally disposed biasing spring carried by a light blocking and unblocking element or member is arranged to engage and be angularly deflected by an angularly projecting tang carried by an insert structure adapted for insertion within a keyboard matrix assembly.

9 Claims, 6 Drawing Figures

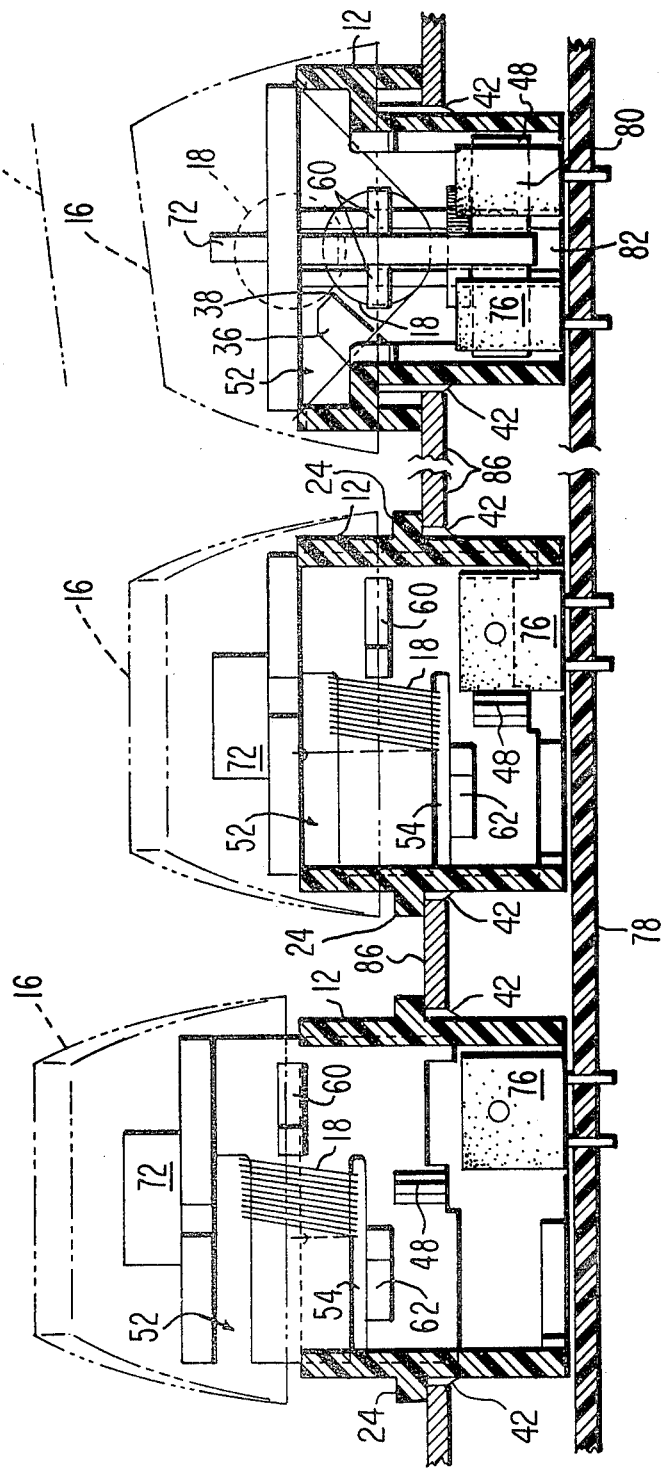

PHOTO-OPTICAL SWITCH APPARATUS

This invention is related to the following U.S. Patent applications; U.S. Ser. No. 124,945 now U.S. Pat. No. 4,301,345 in the name of Justin O. Balta; U.S. Ser. No. 220,130 now U.S. Pat. No. 4,379,968 in the names of Richard I. Ely and Edward I. Nelson now U.S. Pat. No. 4,379,968; and U.S. Ser. No. 246,939 abandoned in favor of continuation application U.S. Ser. No. 501,057 in the name of Edward I. Nelson all assigned to the same assignee as the present invention.

BACKGROUND OF THE INVENTION

1. Field of the Invention

The present invention relates to photo-optical switching mechanisms and more particularly to photo-optical key switches wherein positive acting tactile feel is provided and wherein the switch structure is a modular assembly for demountable incorporation into a keyboard support.

2. Description of the Prior Art

One of the problems with prior art switches both electrical and as well as photo-optical has been the height and profile of the switch mechanism in relation to the surrounding mounting or supporting areas. The higher the key switch profile the more bulky in appearance is the keyboard utilizing the key switch. An additional undesireable feature of the prior art photo-optical switches is the off center location of the actuating spring mechanism against the stem and key of the switch. The off center action causes the switch key top to cock to one side due to the major spring pressure being directed against one side of the switch body.

In earlier style key switches of the photo-optical type the movable parts were not positively locked within the fixed part permitting the two subassemblies to become separated with relatively little effort. The effect of tactile feel, which is highly desireable in order for the operator to determine just when the switch has been "made" or closed is difficult to control and in the past has depended mainly on spring pressure or force. In the present design the tactile feel is positive and designed into the device as an element of a combination.

Prior art photo-optical switches which employ LED light generators and detector pairs utilized a light interrupting element which in the "up" position broke or interrupted the light beam while the "down" position the light beam was coupled through by means of the configured structure of the switch. However, in order to further lower the overall profile of the switch the key stem travel is lessened or shortened so that in the instant structure as claimed in the "up" position the beam is available and uninterrupted while in the "down" position the beam is interrupted or blocked.

The travel (vertical up and down movement of the key) is important for high speed data entry in that the operator cannot tell from touch-no tactile feedback-when or if the switch is closed or made and this effectively breaks the rhythm of the keyboard utilization and in addition creates errors in operation and general slowness in overall key switch actuation. One of the draw backs of the so called membrane keyboard is its lack of travel and uncertain tacticle feel.

SUMMARY OF THE INVENTION

The present invention solves these and other associated problems in a unique, novel and heretofore unobvious manner by providing a modular, three part key switch assembly including a key switch mounting insert, a key stem having means for blocking and unblocking light passing between an LED and detector pair and a demountable key top. A torsion spring, slideably mounted on a horizontally disposed mandrel is centrally positioned relative to the key stem and key top effectively avoiding any angular misorientation or cocking of the key stem and key top relative to the vertical axis thereof. Positive guidance means in the form of an angular tang integral with the insert in conjunction with guides on the key stem assure true vertical up and down movement of the key stem within the insert. Oppositely disposed locking tangs in conjunction with opposite tabs on the key stem enable the key stem to be locked into place after insertion into the insert member. Flexible outboard, oppositely disposed tabs lock the insert into the frame or keyboard structure at the time of assembly. This structural arrangement with suitable frame members enables the keys to be organized at will to suit the convenience of the particular or specific use pattern of operation.

BRIEF DESCRIPTION OF THE DRAWINGS

FIGS. 2 and 3, are partially sectioned, side views of a portion of a keyboard mounting the switches of the present invention;

FIG. 4 is an end view of the structure of FIG. 3;

DESCRIPTION OF THE PREFERRED EMBODIMENT

Figure 1:
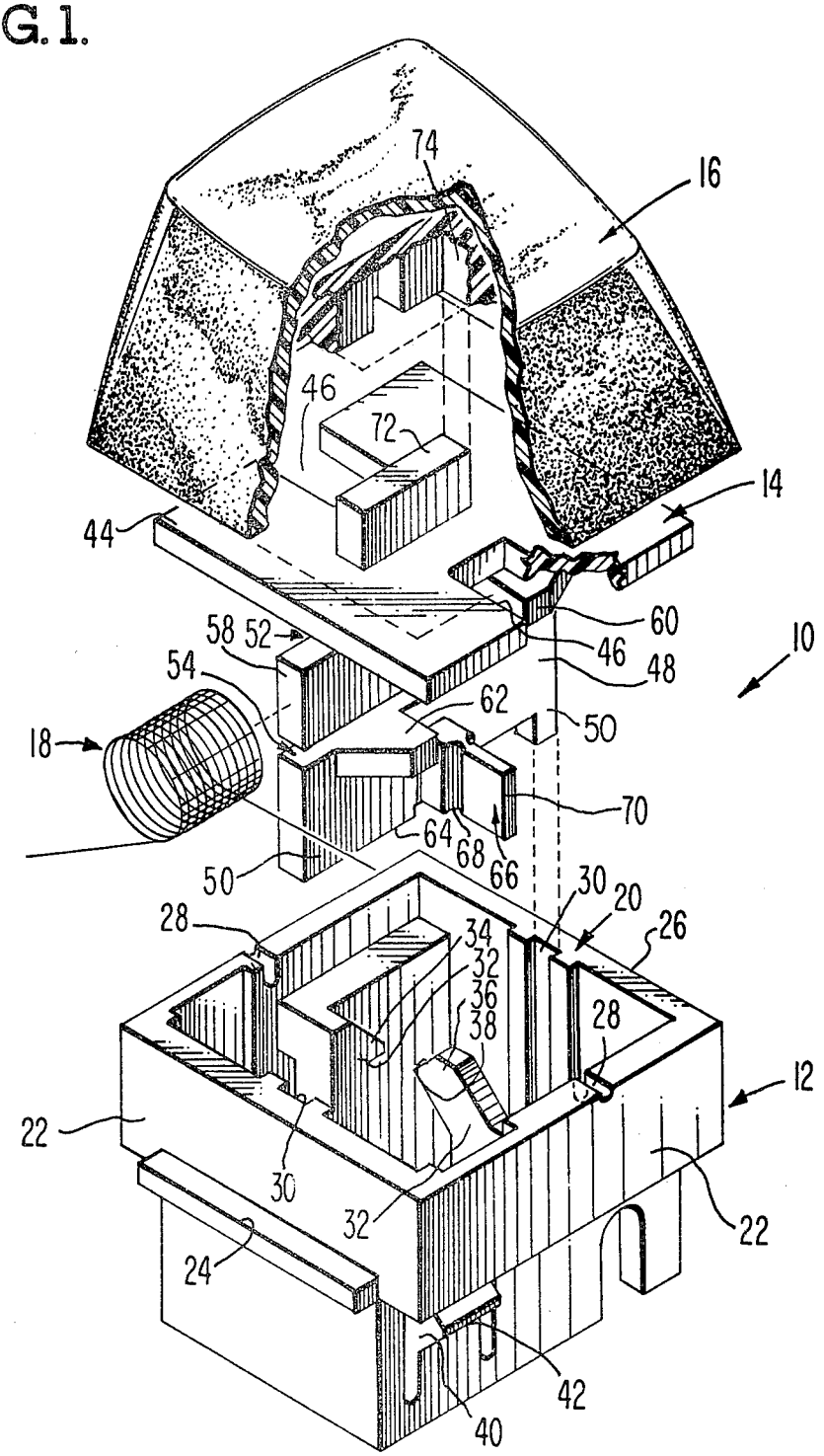
FIG. 1, is an exploded, isometric view of photo-optical switch apparatus in accordance with the present invention.

The pluggable, demountable photo-optical switch mechanism of the present invention is seen by reference first to FIG. 1 of the drawings to comprise three separate, cooperating subassemblies and a torsion spring as will now be described in detail. In an assembled configuration the switch is insertable into previously formed openings 114, in a supporting member which is or may be laid out in a matrix of rows and columns or holes of openings to form a keyboard structure.

The three sets of assemblies of the present photo-optical key switch assembly 10 comprise an insert member 12, a movable key stem member 14, a configured key top 16 and a prewound torsion spring assembly 18. Each one of these assemblies, with the exception of the spring, may be plastic molded parts configured to conform to the elements as herein shown and described.

The keyboard insert 12, is seen in the drawing figures to comprise a box like member 20 substantially square in cross section having oppositely disposed under cut ribs 22—22 and oppositely extending enlongated ribs 24—24 (only one of which is shown in FIG. 1). The upper exposed edge 26 is provided with oppositely arranged spring retaining notches 28 therein for purposes to be explained later on herein.

Internally, the member 20 is irregularly shaped as seen in FIG. 1 and includes two vertically disposed oppositely oriented guide slots 30 extending from top to bottom thereof. Oppositely disposed, parallel, vertical ribs 32—32 terminate at the top in individual, angularly shaped wedging members 34—34 for purposes still to be described. Projecting outwardly, away from the near rib 32 in FIG. 1, is an angled tang 36 the forward end 38 thereof extending slightly, vertically upwardly out into the open area of the square open member 20 for purposes to be described shortly.

Figure 5:
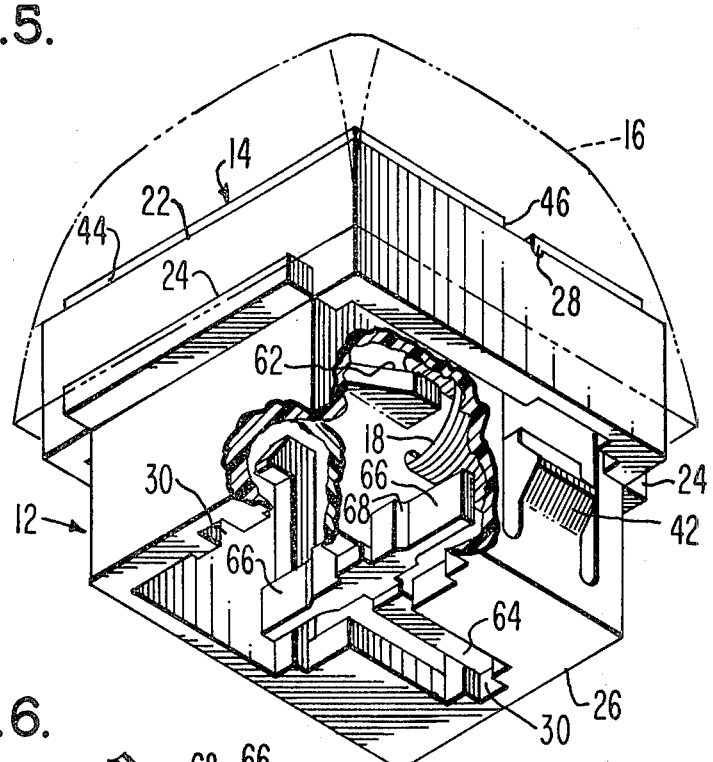
FIG. 5, is an enlarged isometric view from underneath, of the switch apparatus of FIG. 1.

Integral with the bottom portion 20 of member 12 and arranged, one one each side thereof, is a semirigid, yet slightly flexible locking tab 40, the outwardly extending portion 42 of which (shown more clearly in FIG. 5) is upwardly angled, as seen in FIG. 1, so as to permit the insert 20 to be slideably receivable within an opening (not shown) in a keyboard support and to thereafter lock into position by snapping over the edge of the opening thus preventing accidental dislodgement or removal.

The moveable key stem 14 is T-shaped member as seen in FIG. 1. The crossbar of the T comprises a flat substantially square planar member 44 having two oppositely disposed integral slots 46—46 therein extending inwardly from opposite edges thereof. Depending from the flat portion 44 (substantially centrally thereof) is an integral, elongated, vertically extending member 48, the opposite edges 50 of which are receivable within the oppositely disposed vertical slots 30 of the insert member 20 for vertical, slideable "up and down" movement therewithin, FIG. 1, for purposes still to be described.

Member 48 includes an upper and a lower horizontally extending slot 52 and 54 respectively FIGS. 2, 3 and 4, providing a projecting mandrel-like mounting member 58 for receiving the coil torsion spring 18 there around as previously referred to herein. Oppositely disposed, integral, outwardly extending inboard and outboard wedge like tabs 60 and 62 respectively act to captivate the spring 18 once the latter has been introduced over the mandrel 58.

Figure 6:
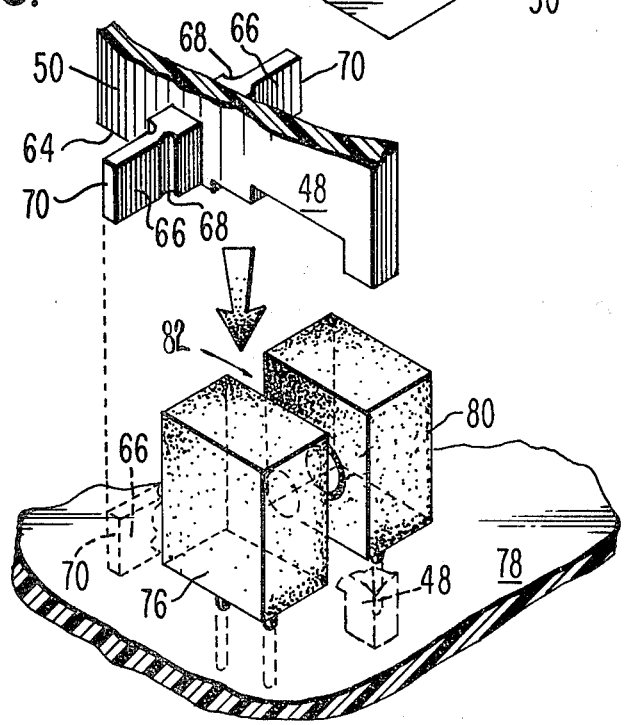
FIG. 6, is a greatly enlarged sectional view of the LED and detector pair in conjunction with the light blocking member of the present invention.

The lower edge 64 of member 48 is irregularly shaped as seen in the various figures of the drawings and includes oppositely disposed transverse, wing-like member 66—66, only one of which can be seen in FIG. 1, extending outwardly at right angles to the vertical plane of member 48 FIG. 6. Each of the members 66—66 may be vertically undercut as at 68, effectively, slightly weakening the member at this point, and permitting the outboard ends 70 thereof to flex out of the plane of the member, slightly back and forth, for purposes to be described shortly herein.

The upper surface 44 of member 14 includes a centrally disposed, vertically extending, rectangular projection or rib 72 upstanding from the flat face 44 and adapted to inter-engage a mating slot 74 in press or snap fit relationship within the hollow area of key top 16. This arrangement permits the interchange of key tops at will without disassembly of the base or stem portion of the key switch. The key top 16 may be molded or pressed from a wide variety of plastic materials of the type which are fire resistant and sufficiently rigid to withstand the handling which the keys of a keyboard generally receive during use.

As earlier mentioned herein, the present invention is directed to a photo-optical switching device wherein no electrical moving parts are employed and wherein no electrical contacts are "made or broken" thereby avoiding the associated operational of problems of electrical switches.

The optics for the present invention comprise a light emitting diode assembly 76 FIG. 6 projecting upwardly through the insert 12 and secured against displacement on a printed wiring assembly 78 as by having its contacts pressed into openings therein which have been metalized so as to make good electrical contact. Conversely, the LED's and detectors may be soldered in place. An oppositely disposed light receptor assembly 80, likewise secured on the printed circuit board 78 and spaced from the LED 76 is arranged in such a manner that in the non actuated "off" condition of the switch assembly light from diode 76 passes across the open space 82 to impinge on the photo receptor 80. Note that in the normal-rest or nonoperating condition of the switch structure as in FIG. 2 the light blocking portion 48 of the stem 14 is raised to a position permitting light from the LED to cross this space.

ASSEMBLY

As earlier described herein the present invention comprises the demountable insertable, photo-optical switching device in the nature of a keyboard switch and, to this end, the assembled apparatus is to be disposed in openings 84 formed in a keyboard mounting plate 86 by means of mounting inserts 12. Each insert mounting 12 is snapped into place and secured therein against dislodgement by means of the oppositely disposed, semi-flexible locking tabs 42 with the ledge or rib member 24 resting against the periphery of the respective openings.

In the normal course of assembly, the moveable stem is first provided with torsion spring 18 which is placed over the mounting mandrel 58 so that the opposed spring ends are seated between the confronting flat straight edges of the wedge shaped retaining tab members 60 and 62. The stem 14 is then guided over the insert 12 so that the vertical members 50 are received in sliding engagement with the vertical side wall slots 30—30. Thereafter the stem is pushed downwardly into the insert body causing the flexible wing-like members 66—66 to snap in behind the outwardly projecting wedge shaped tangs or tabs 34—34 only one of which is clearly shown in FIG. 1 effectively restraining the key stem against the dislodgement from the insert. At this point the stem is biased upwardly against the pressure of the spring 18 the opposite ends of which are seated and restrained within the spring receiving notches or slots 28 in the top edges of opposite side walls 22—22. The key top 16 is next pressed or snap fitted to the key stem by means of the vertical rectangular post 72 and the mating slot 74. The photo-optical switch assembly 10 is now ready for positioning within the keyboard support 86. The PC board carrying the rows and columns of LEDs and photo receptors 76 and 80 respectively is next staked to the ends of the support structure 86 in conventional fashion, and held by twist tabs so that each LED photo receptor pair straddles and individual light blocking member 48.

OPERATION

As seen in the step views of FIGS. 2, 3 and 4, as the operator depresses the key, the key stem is lowered to bring the light blocking portion 48 down in between the LED photo receptor pair until the spring "side" is engaged with the outwardly angled projection 36. At this point further depression of the key top by the operator causes the tang or tab 36 to shift the spring off vertical center effectively providing a tactile sense to the operator such that he or she is made physically aware of the position of the key stem and that the light has been blocked and that the key switch has been closed in the parlance of a typical electrical switch. The pressure of the spring of course, is sufficient to retract the key top once the finger pressure is relieved and the key stem will snap vertically upwardly so as to permit the light from the LED to pass to the photo receptor in an unblocked condition.

The utilization of the tactile feedback tang 36 in conjunction with the opposite disposed spring retaining wedge members, permitting the spring to be centrally oriented with respect to the vertical up and down movement of the key stem, provided the operator with a positive tactile feedback feel which has not heretofore been available in either electrical or photo-optical key switches and effectively permits a higher speed operation since the operator is made positively aware of the condition of the switch at all times.

The present invention provides a lower profile switch structure (i.e. the height of the overall mechanism and its return spring is positively centered on its support which improves the vertical angle of the key stem and prevents locking of the key. The key stem and insert are provided with a positive locking feature when assembled effectively permitting easy disassembly or "pull apart" removal. The integral projection or tang, in pressing against the spring, provides a positive mechanical tactile feel. By inverting the LED-detector pair operation and causing the light to be coupled through prior to switch movement the over-all key switch profile is effectively lowered.

What is claimed is:

1. Photo-optical switch apparatus comprising,
   a mounting structure providing a housing for photo-optical light generating and detecting means disposed in spaced relation such that light can pass from a light generator to a light detector in the unblocked condition of said apparatus,
   light blocking means slideably movable relative to said mounting structure and including means slideably carried thereon for biasing said light blocking means into a light unblocking position relative to said light generating and detecting means,
   means on said mounting structure in the path of movement of said light blocking means engageable with said biasing means when said light blocking means has moved to the light blocking position for generating positive tactile feedback or feel indicative of the position of said light blocking means relative to said light generating means and said detecting means,
   means integral with said light blocking means for guiding and locking said light blocking means within said support structure effective to prevent accidental dislodgement thereof while permitting vertical slideable movement of said light blocking means relative to said support structure and said light generating and detecting means, and
   demountable means providing a finger engaging member operably interconnected with said light blocking means so that physical movement or pressure against said finger engaging means will cause said light blocking means to move into a light blocking position.

2. The invention in accordance with claim 1 wherein said mounting structure comprises a preformed, dielectric, molded hollow, box-like insert member including perimeter means for mounting said structure within a preformed aperture in a keyboard matrix, said structure further including semi-rigid yet flexible means on said insert member permitting said latter member to be snapped into said aperture for locked retention therein.

3. The invention in accordance with claim 1 wherein said mechanical means providing tactile feel or feedback comprises an integral, inwardly turned, upwardly angled, elongated projection disposed in the path of movement of said biasing means so that said projection compresses said biasing means normal to its vertical up and down path of movement effective to produce a tactile feedback indication of the position of said light blocking means within said structure.

4. The invention in accordance with claim 1 wherein said mounting structure further includes oppositely disposed vertical elongated channels for slideably guiding said light blocking means within said structure enabling said latter means to move vertically up and down with respect to said mounting structure while remaining centered therewithin.

5. The invention in accordance with claim 1 further including a central horizontally disposed mounting hub for mounting said biasing means and oppositely disposed integral retaining members for retaining said biasing means against accidental dislodgement from said mounting hub.

6. Photo-optical switching apparatus comprising,
   an insert structure including means for mounting said structure within preformed openings or apertures in an operably associated keyboard member effective to provide a matrix array for said keyboard,
   said insert structure including mechanical means providing operator tactile feel and including guiding and locking means therein,
   light blocking means slideably moveable within said insert structure including means for mounting a torsion spring centered thereon,
   a coiled torsion spring mounted on said latter means,
   said light blocking means further including oppositely disposed guide members slideably receivable in oppositely disposed guide channels, oppositely disposed semiflexible means operably engageable with said locking means causing said light blocking means to be trapped within said insert structure after insertion therein, and operator engaging means press fitted to one end of said light blocking means enabling said light blocking means to be moved against the tension of said torsion spring to a light blocking position and thereafter returned automatically to a nonblocking position,
   said mechanical means engaging said torsion spring during the movement of said light blocking member from the unblocked to the blocked condition of the switch causing the spring to slightly shift the light blocking means off vertical center effectively tactily indicating to the operator the position of the switch key.

7. The invention in accordance with claim 6 wherein the outboard opposite ends of said torsion spring are disposed in offset channels or grooves in the upper parallel edge portions of said mounting structure effectively restraining said spring against lateral movement.

8. The invention in accordance with claim 6 wherein said spring is restrained on the spring mounting means on said light blocking means by means of wedge shaped members tapered in opposite directions from the center of the vertical portion of said light blocking member and disposed and displaced horizontally relative to each other.

9. The invention in accordance with claim 6 wherein the depending end of said light blocking member is provided with integral, oppositely disposed wing-like tangs sufficiently flexible to bow slightly and be received over opposite integral tabs on said mounting structure upon insertion therein and thereafter be retained against said tabs effective to prevent accidental dislodgement or removal.

* * * * *

UNITED STATES PATENT AND TRADEMARK OFFICE
CERTIFICATE OF CORRECTION

PATENT NO. : 4,479,111

DATED : Oct. 23, 1984

INVENTOR(S) : Craig C. Madsen, Daniel B. Stewart, James Andree

It is certified that error appears in the above—identified patent and that said Letters Patent is hereby corrected as shown below:

Col. 5, line 23, "effectively permitting easy disassembly" should read --effectively preventing easy disassembly--.

Signed and Sealed this

Twenty-sixth Day of March 1985

[SEAL]

Attest:

DONALD J. QUIGG

Attesting Officer    Acting Commissioner of Patents and Trademarks